(12) United States Patent
Mizokawa et al.

(10) Patent No.: US 7,278,812 B2
(45) Date of Patent: *Oct. 9, 2007

(54) CONVEYANCE SYSTEM

(75) Inventors: Takumi Mizokawa, Tokyo (JP); Makoto Omori, Aichi (JP); Yuzo Takakado, Aichi (JP); Hitoshi Kawano, Mie (JP)

(73) Assignee: Shinko Electric Co., Ltd., Tokyo (JP)

( * ) Notice: Subject to any disclaimer, the term of this patent is extended or adjusted under 35 U.S.C. 154(b) by 311 days.

This patent is subject to a terminal disclaimer.

(21) Appl. No.: 11/045,787

(22) Filed: Jan. 28, 2005

(65) Prior Publication Data

US 2005/0214103 A1    Sep. 29, 2005

Related U.S. Application Data

(63) Continuation-in-part of application No. 09/490,507, filed on Jan. 25, 2000, now Pat. No. 6,863,485.

(30) Foreign Application Priority Data

Jan. 27, 1999  (JP) .............................. H11-019034
Apr. 27, 1999  (JP) .............................. H11-120563

(51) Int. Cl.
    *B65G 49/07* (2006.01)
(52) U.S. Cl. .................................. 414/217; 414/749.3
(58) Field of Classification Search ................ 414/217, 414/222.13, 225.01, 226.05, 749.3
    See application file for complete search history.

(56) References Cited

U.S. PATENT DOCUMENTS 4,319,864 A * 3/1982 Kaufeldt .................. 414/751.1

(Continued)

FOREIGN PATENT DOCUMENTS

| JP | H04-288812 A | 10/1992 |
| JP | H06-016206 | 1/1994 |
| JP | H07-211763 A | 8/1995 |
| JP | H07-264716 | 10/1995 |
| JP | H08-051137 | 2/1996 |

(Continued)

OTHER PUBLICATIONS

Japanese Office Action dated Jun. 20, 2006.

*Primary Examiner*—James Keenan
(74) *Attorney, Agent, or Firm*—Brinks, Hofer, Gilson & Lione

(57) ABSTRACT

A wafer conveyance system is described for transporting one or more wafers that undergo, while being transported, different processes at a plurality of wafer processing apparatuses inside which one or more wares are processed. A hermetically closed chamber is provided that defines an isolated environment inside which a controlled atmosphere. At least one guide path is provided inside the hermetically closed chamber. At least one mobile element is movable inside the hermetically closed chamber along the at least one guide path to transport one or more wafers from one wafer processing apparatus to another. A plurality of position sensors that detect positions of the at least one mobile element are deployed along each of the at least one guide path in such a manner that they are deployed at intervals close together when near the wafer processing apparatuses and deployed at wider intervals elsewhere. In another aspect, the guide rails may be constructed of a plurality of connectable rail units. Because the guide rail can be disconnected and/or connected between rail units having position sensors, rearrangement and/or reattachment of the plurality of position sensors is not necessary when changing a configuration and/or extending the layout of the guide rail.

16 Claims, 13 Drawing Sheets

U.S. PATENT DOCUMENTS

| | | |
|---|---|---|
| 4,624,617 A | 11/1986 | Belna |
| 5,002,455 A | 3/1991 | Kuriyama et al. |
| 5,417,537 A | 5/1995 | Miller |
| 5,442,416 A | 8/1995 | Tateyama et al. |
| 5,844,662 A | 12/1998 | Akimoto et al. |
| 6,053,687 A | 4/2000 | Kirkpatrick et al. |
| 6,091,498 A | 7/2000 | Hanson et al. |
| 6,230,721 B1 | 5/2001 | Miyasako |
| 6,235,634 B1 | 5/2001 | White et al. |
| 6,863,485 B2 * | 3/2005 | Mizokawa et al. ......... 414/217 |

FOREIGN PATENT DOCUMENTS

| | | |
|---|---|---|
| JP | H09-162260 | 1/1997 |
| JP | H09-283591 | 10/1997 |
| WO | WO 98/19333 A1 | 5/1998 |

* cited by examiner

CONVEYANCE SYSTEM

This application is a Continuation-in-part of U.S. patent application Ser. No. 09/490,507 filed Jan. 25, 2000 now U.S. Pat. No. 6,863,485, the entire content of which is hereby incorporated by reference.

BACKGROUND

1. Field of the Invention

The present invention relates to a conveyance system for conveying one or more wafers between a plurality of wafer processing apparatus.

2. Description of the Related Art

The manufacture of integrated circuits (IC's) and Large-Scale Integration (LSI) logic onto wafer substrates may require large amounts of processing to be performed on the wafers. Wafers may need to be conveyed to a variety of processing apparatuses during the manufacturing process. FIG. 1 is a schematic plan view showing equipment for processing wafers. The equipment may sequentially perform processes A-Z on the wafers. Wafer processing apparatus A, wafer processing apparatus B, etc. through wafer processing apparatus Z may be arranged as shown. These wafer processing apparatuses may be provided with stockers SA, SB, etc. through SZ for each processing apparatus. Each stocker may house a plurality of cassettes capable of accommodating stacked wafers. Additionally, n wafer processing apparatuses A1-An may be arranged in a row. And n wafer processing apparatuses B through Z may be arranged as the n wafer processing apparatus A1-An. A rail AR, BR, etc. through ZR from the stocker corresponding to each wafer processing apparatus may be provided adjacent the n aligned wafer processing apparatuses. The rail AR, BR, etc. through ZR may be arranged for guiding a cassette transfer apparatus (not shown) to convey cassettes from one apparatus to another.

A cassette transfer apparatus traveling along the rail AR may withdraw a cassette from the stocker SA, move the cassette along the rail AR, and place the cassette in front of the wafer processing apparatus A1. Referring also to FIG. 2, when the cassette transfer operation has been performed, a cassette 4 housing a plurality of stacked wafers may be positioned in front of n wafer processing apparatus A. A wafer transfer apparatus 2 may be arranged between the cassette 4 and the wafer processing apparatus A. The wafer transfer apparatus 2 may remove a wafer in the cassette 4 and set it in the wafer processing apparatus A. After the set wafer has undergone the process A by the wafer processing apparatus A, the A-processed wafer may be extracted from the wafer processing apparatus A by the wafer transfer apparatus 2 and re-housed in the cassette 4. When this process has been performed for every wafer in cassette 4, the wafers may be returned to the stocker SA by way of the in-process cassette transfer apparatus which may travel along the rail AR.

The cassette 4 which now includes wafers that have undergone the process A may be moved from the stocker SA to the stocker SB, which may correspond to the wafer processing apparatus B. The movement of the cassette 4 between stockers may be performed by means of an inter-process cassette transfer apparatus (not shown). The inter-process cassette transfer apparatus may move on the rail SR provided parallel to each stocker. This inter-process cassette transfer apparatus may remove the cassette 4 from the stocker corresponding to the wafer processing apparatus of the previous stage, move to the position in front of a stocker corresponding to the wafer processing apparatus of the next step, and place the cassette 4 in this stocker. In this way, the cassette 4 may be moved between stockers.

When the cassette 4 is moved from the stocker SA to the stocker SB by the inter-process cassette transfer apparatus, the cassette 4 may be conveyed from the stocker SB by the in-process cassette transfer apparatus along the rail BR. The wafer transfer apparatus provided for each wafer processing apparatus B may remove one wafer at a time from the cassette 4 as in the case of the process A described above. The wafer transfer apparatus may set the wafer in the wafer processing apparatus B to perform the process B. After the processing, the B-processed wafers may be returned to the cassette 4, and when all of the B-processed wafers have been returned to the cassette 4, the cassette 4 may be returned to the stocker SB by the in-process cassette transfer apparatus. LSI and IC's may be produced by repeating this type of operation through process Z.

Using the semiconductor producing equipment described above, it is not possible to go on to process B until process A has been completed with respect to all of the wafers housed in the cassette 4 housed in the stocker. A large amount of time may occur to produce semiconductors which necessitate a large number of processing steps. Additionally, during the period from when the process A has been performed until the next process B is performed, the processed wafers may be housed for a long time inside cassette 4. If the wafers are left for a long time after performing a wafer cleansing process before going on to the next coating process, dust may adhere to the wafers or the wafers may oxidize, thus reducing the yield.

Although production time may not be a problem when performing mass production of the same type of product, in the case of small-scale production of a prototype or other small-scale projects, a large production time may be a problem. Since a large number of transfer apparatus, such as an in-process cassette transfer apparatus, inter-process cassette transfer apparatus and wafer transfer apparatus are required, the cost of equipment production may increase, thereby increasing the production cost of the final product.

BRIEF SUMMARY

A wafer conveyance system is described for transporting one or more wafers that undergo, while being transported, different processes at a plurality of wafer processing apparatuses inside which one or more wares are processed. A hermetically closed chamber is provided that defines an isolated environment inside which a controlled atmosphere. At least one guide path is provided inside the hermetically closed chamber.

A plurality of ducts that each communicate the isolated environment of the hermetically closed chamber with the inside of one wafer processing apparatus such that the hermetically closed chamber is in communication with one or more wafer processing apparatuses. At least one mobile element is movable inside the hermetically closed chamber along the at least one guide path to transport one or more wafers from one wafer processing apparatus to another. At least one arm is provided on each mobile element, each arm being accessible to the inside of each wafer processing apparatus through a corresponding duct to load one or more wafers into a wafer processing apparatus and unload the same therefrom. A plurality of position sensors that detect positions of the at least one mobile element are deployed along each of the at least one guide path in such a manner that they are deployed at intervals close together when near the wafer processing apparatuses and deployed at wider intervals elsewhere.

In another aspect, the guide rails may be constructed of a plurality of connectable rail units. Because the guide rail can be disconnected and/or connected between rail units having position sensors, rearrangement and/or reattachment of the plurality of position sensors is not necessary when changing a configuration and/or extending the layout of the guide rail.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

FIG. 1 is a schematic plan view showing an example of a semiconductor production equipment.

DETAILED DESCRIPTION OF THE DRAWINGS AND THE PRESENTLY PREFERRED EMBODIMENTS

A conveyance system is described for conveying one or more wafers between a plurality of wafer processing apparatus having a wafer exchange position.

Wafer Conveyance System

Figure 1:
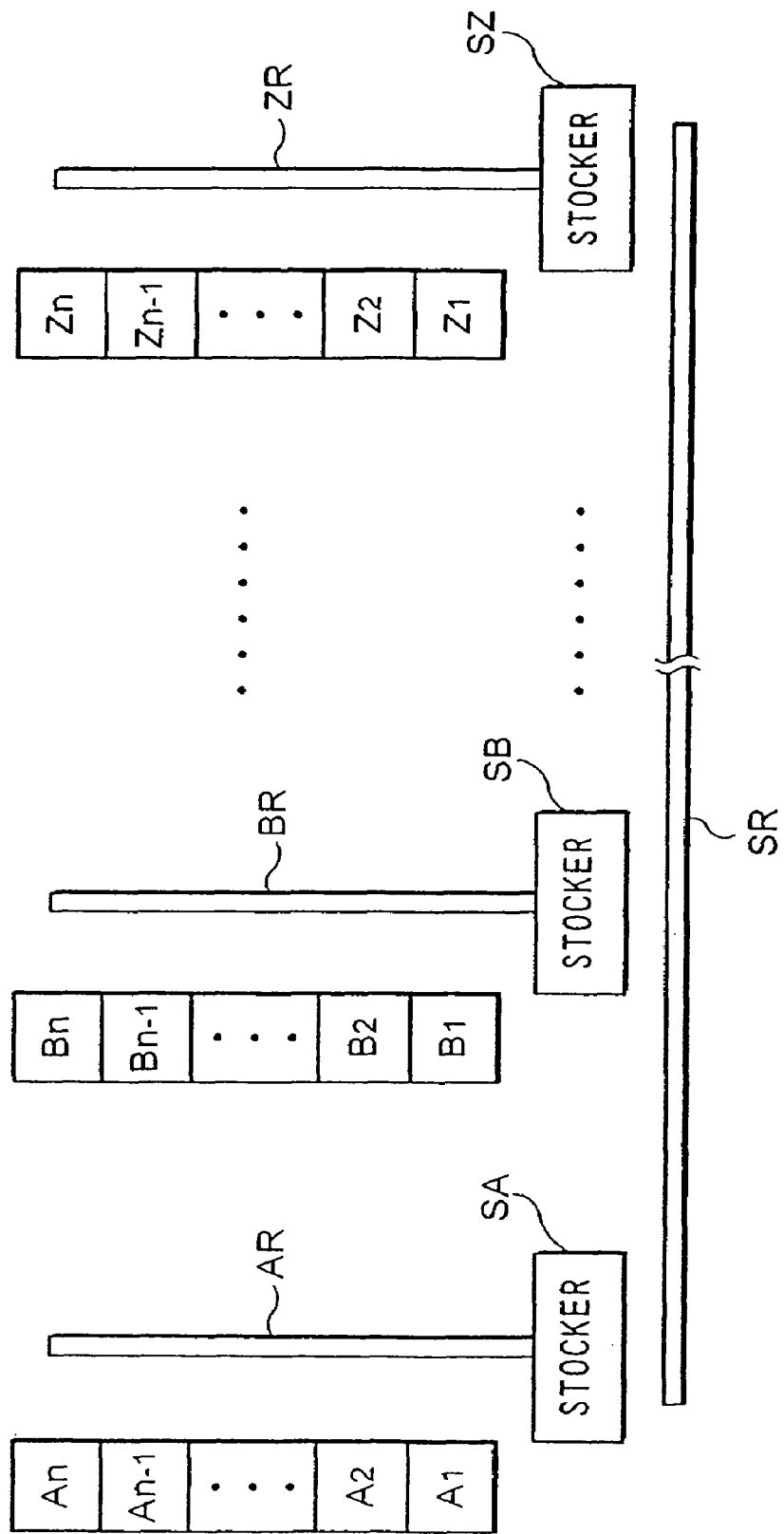
FIG. 1 is a The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.
Figure 2:
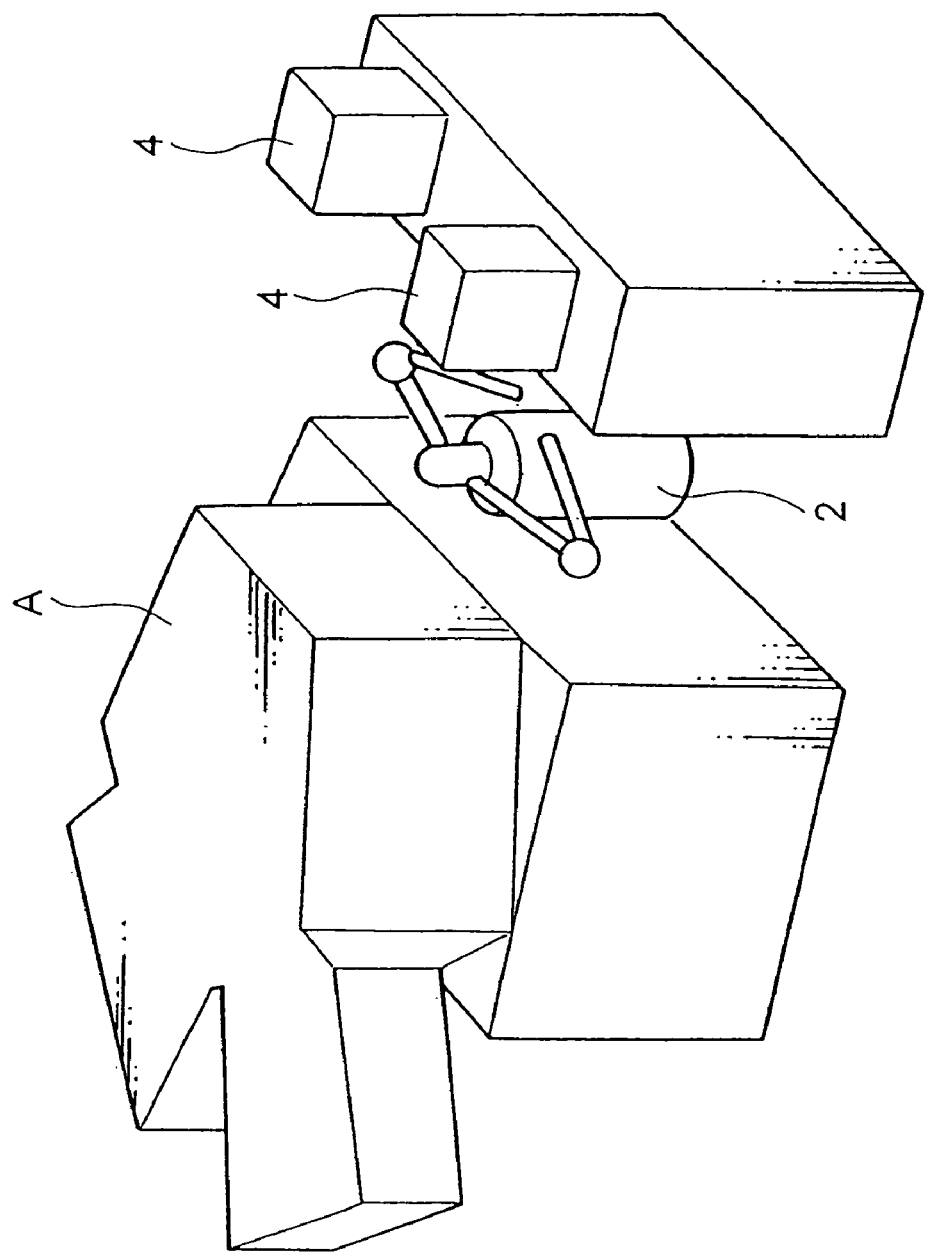
FIG. 2 is a drawing for explaining a method for setting a wafer onto a wafer processing apparatus in the semiconductor production equipment.
Figure 3:
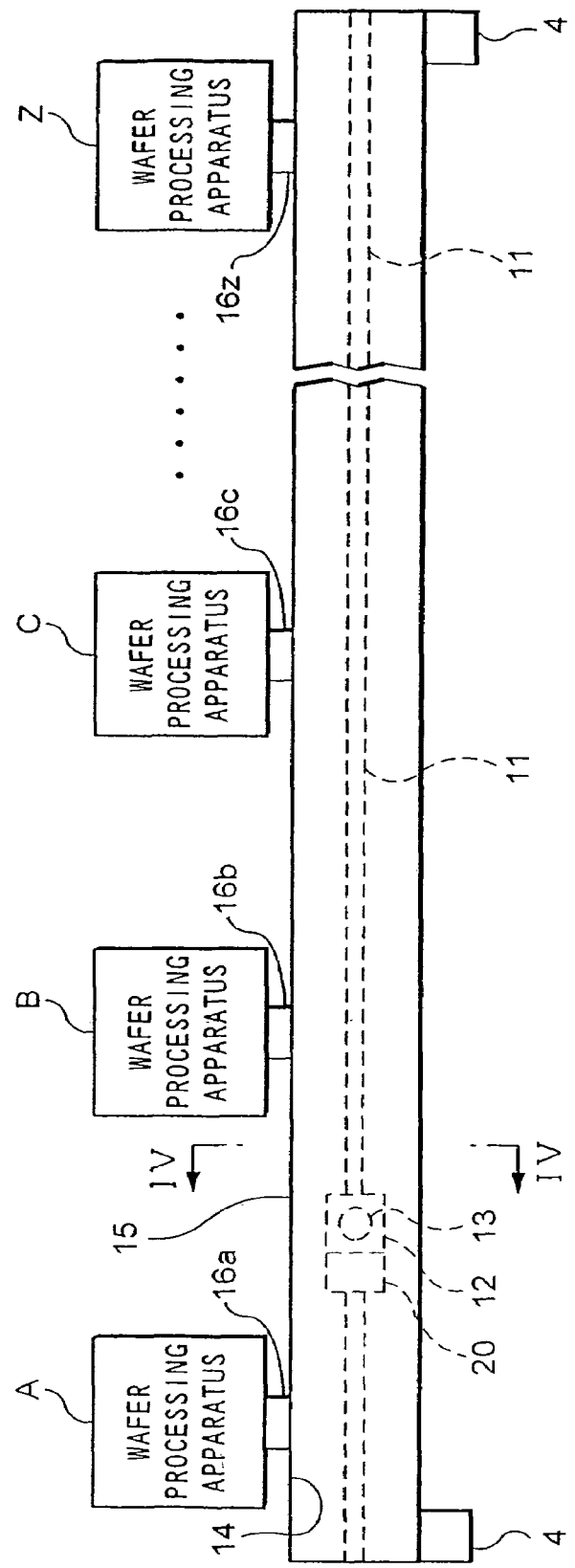
FIG. 3 is a schematic plan view showing semiconductor production equipment provided with a wafer conveyance system.

FIG. 3 is a schematic plan view of semiconductor production equipment provided with a wafer conveyance system. Processes A, B, and C through Z may be performed on the wafers with the semiconductor production equipment. The wafer processing apparatus A, wafer processing apparatus B, and wafer processing apparatus C through wafer processing apparatus Z for performing these processes may be arranged linearly, such as in a left-right direction of the diagram.

Adjacent each wafer processing apparatus, a roughly box-shaped chamber 14 may be formed. The chamber 14 may be formed at a front of each wafer processing apparatus. The chamber 14 may be formed in parallel to the direction of alignment of the wafer processing apparatus. Inside the chamber 14, a guide rail 11 may be provided along a side of the chamber 14, and a mobile element 12 may be provided movably along this guide rail 11. This mobile element 12 may include a wafer transfer robot (wafer exchange element) 13. The wafer transfer robot 13 may be capable of holding a wafer at a time, and capable of moving a held wafer within a predetermined range. The wafer transfer robot 13 may move along the guide rail 11 in conjunction with the movement of the mobile element 12. Additionally, on the movable direction (right-left direction in FIG. 3) side of the mobile element 12, a controller unit 20 having a controller for controlling the actions of this mobile element 12 is attached. While the movable direction is described as being right to left for purposes of explanation, movement in other directions is also contemplated.

Cassettes 4 may be positioned at both ends of the chamber 14. The cassettes 4 may be capable of housing a plurality of stacked wafers. As the mobile element 12 moves near the cassette 4, the wafer transfer robot 13 is able to withdraw a wafer from the cassette 4. Additionally, a wafer insertion portion of each wafer processing apparatus may be connected to the chamber 14 by ducts 16a, 16b, and 16c through 16z. By way of the ducts 16a, 16b, and 16c through 16z, the wafer transfer robot 13 may exchange wafers between the wafer processing apparatus and a sealed space, such as from chamber 14 via duct 16a.

Figure 4:
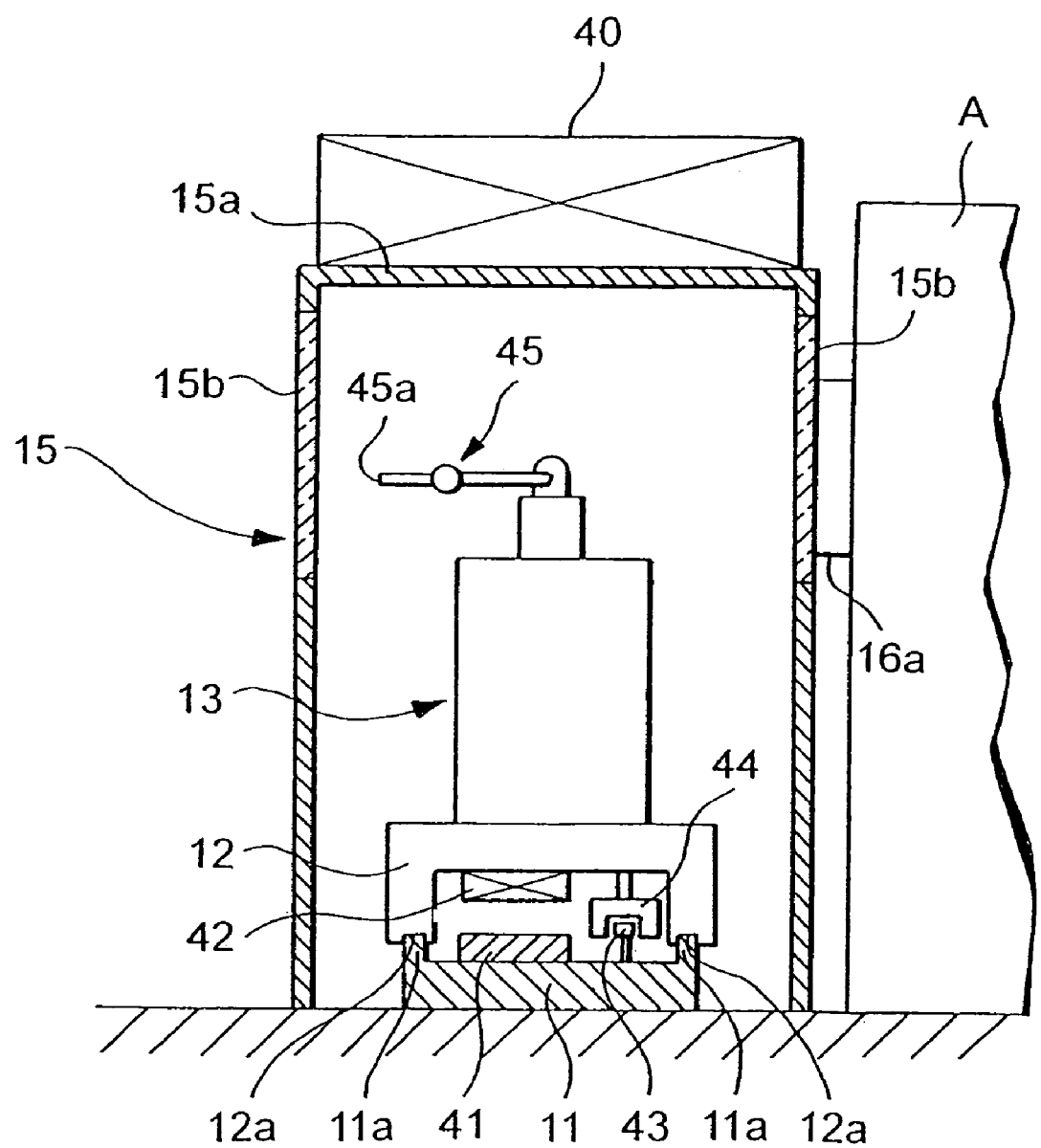
FIG. 4 is a view as viewed along a line IV-IV in FIG. 3.

FIG. 4 is a view as viewed along the line IV-IV in FIG. 3. The chamber 14 may be formed by elements such as partition panels 15. FFU (fan filter units) 40 may be provided at a top of the roof panel 15a of the partition panel 15. The FFU 40 may send large amounts of clean air through a ventilation port formed in the roof panel 15a. As a result, the chamber 14 may form a space that is cleaner than the outside of the chamber 14. The inside of the chamber 14 may be a local clean room. A transparent material may be used for the portion 15b of the partition panel 15. The transparent material may span the height of the top portion (around the arm to be described later) of the wafer transfer robot 13. As a result, a supervisor can observe from outside the chamber 14 whether the wafer transfer robot 13 is operating normally.

Referring also to FIG. 3, a guide rail 11 may be provided at the bottom portion of the chamber 14, and a magnet 41, such as first magnetic field generating element, may be provided on guide rail 11. Additionally, a projection 11a may project upward from both ends of the guide rail 11. A depression 12a may be formed in the mobile element 12. The depression 12a of the mobile element 12 may be adapted to slide in the projection 11a. The mobile element 12 may be enabled to move along the guide rail 11. An excitation coil 42, such as second magnetic field generating element, may be attached on the bottom surface of the mobile element 12 at a position opposite to the magnet 41. A propulsion force may be achieved from the excitation coil 42 located on the mobile element 12 and the magnet provided on the guide rail 11. That is, the mobile element 12 may driven by a linear motor having the magnet 41 and the excitation coil 42.

The guide rail 11 may be provided with an electrical supply line 43, such as along the direction of movement of the mobile element 12 along the guide rail 11. On the mobile element 12, a C-shaped electrical receiving coil 44, such as an electrical receiving element, may be provided to cover three sides of the electrical supply line 43. When an electric current is supplied to the electrical supply line 43, an electromotive force may be created at the coil 44 by way of the magnetic field generated around the electrical supply line 43. The electromotive force may be supplied to the power a supply circuit and/or controller, such as the supply circuit and controller described below. Electric power may be supplied to the power supply circuit of the mobile element 12, and the power may magnetize the excitation coil 42. Thus, the electric power may be supplied without electrical contact with the mobile element 12.

A wafer transfer robot 13 may be attached to the mobile element 12, such as at a top portion. The wafer transfer robot 13 may include an arm 45 which can freely move in any direction, such as up, down, left or right and is capable of rotating. At a tip portion of this arm 45, a holding portion 45a may be provided that is capable of holding a wafer. The wafer transfer robot 13 is capable of entering the holding portion 45a from the chamber 14 through the duct 16a and into a wafer insertion portion of each wafer processing apparatus. By entering the holding portion 45a into the wafer insertion portion of the wafer processing apparatus, the exchange of one wafer at a time between each wafer processing apparatus can be performed. The wafer transfer robot 13 may be capable of exchanging wafers with a high degree of precision, for example, a precision of about 50 µm, to be able to reliably set a wafer to the wafer insertion portion of each wafer processing apparatus.

While the guide rail 11 is shown set at the bottom portion of the chamber 14, other configurations may be implemented such that the guide rail 11 and magnet 41 forming the linear motor may, for example, be provided on the side portion of the chamber 14. Additionally, while the supply of power to the mobile element 12 is performed without contact using the electrical supply line 43 and the receiving coil 44, the power supply may be supplied by cable using cable bearers if the distance of movement of the mobile element 12 is short. Furthermore, while the magnet 41 is provided above the guide rail 11, the invention is not so restricted, and it is possible to move the mobile element 12 along the guide rail 11 using various known types of linear motors. For example, it is possible to position a lattice panel on top of the guide rail, and generate a propulsive force with the excitation coil 42 of the mobile element 12 by way of a linear motor.

Figure 5:
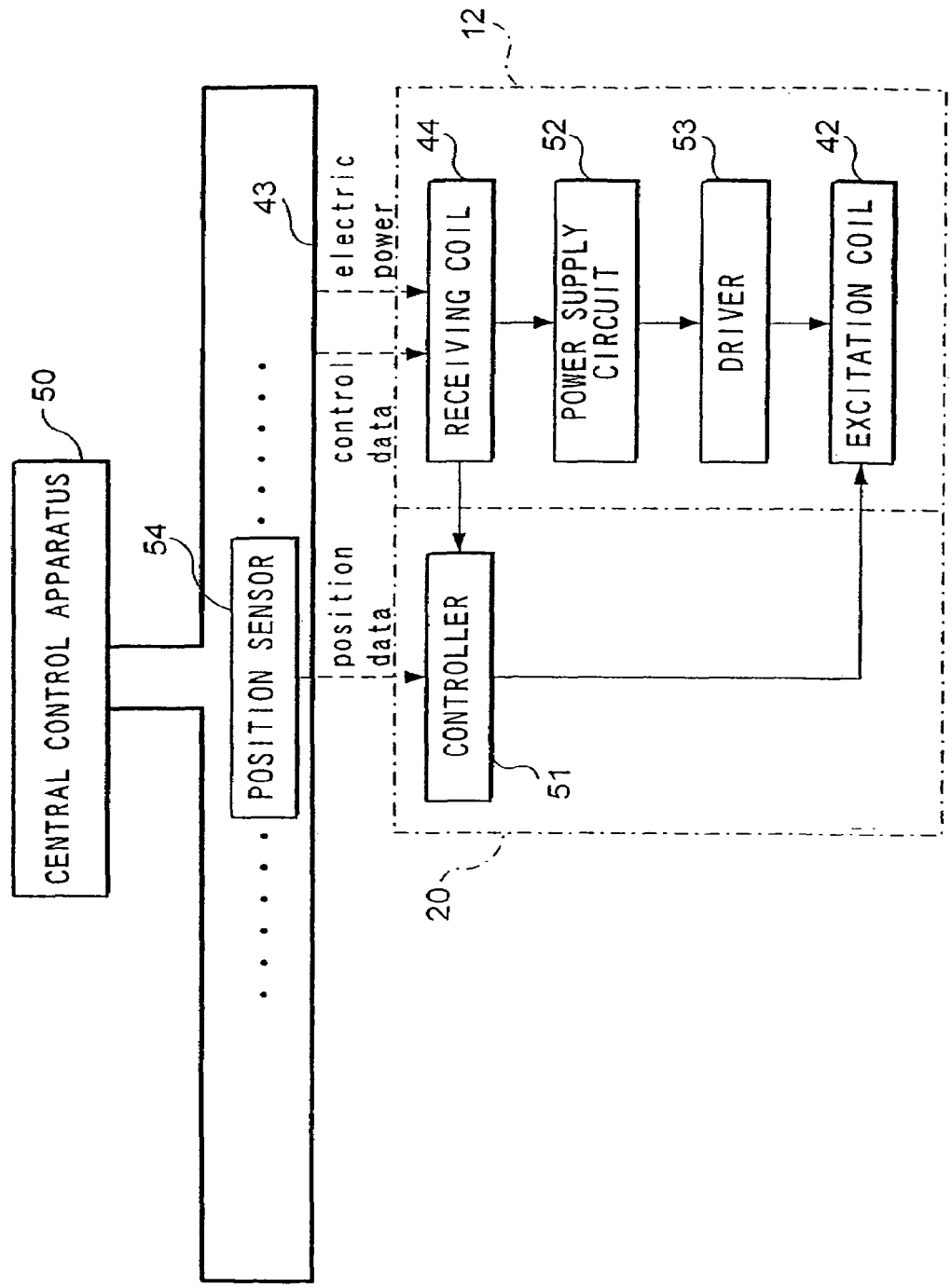
FIG. 5 is a block diagram showing the structure of a control system in a wafer conveyance system.

In FIG. 5 is a schematic diagram of a central control element, such as a control apparatus 50, which may be used to control the system. The control apparatus 50 may supply an electric current containing control data signals to the electrical supply line 43. For example, the control apparatus 50 can supply an electric current having amplitudes or the like corresponding to the control data. The control data supplied to the electrical supply line 43 may be received on the mobile element 12 by the electrical receiving coil 44. The received control data may be supplied to a controller 51 provided in the controller unit 20. Additionally, as described above, the electric power acquired by the electrical receiving coil 44 may be supplied to the driver 53 after voltage regulation at the power supply circuit 52. The controller 51 may control the driver 53 based on the control data from the central control apparatus 50 and position data of the mobile element 12 supplied from a plurality of mobile element detecting sensors, such as position sensors 54, positioned along the guide rail 11. The central control apparatus 50 may provide instructions to the driver 53 for the stopping position of the mobile element 12. For example, the central control apparatus 50 may provide instructions to the driver 53 for the mobile element 12 to stop in front of the wafer processing apparatus A. The controller 51 may perform feedback control based on the position data from the position sensors 54 to more precisely stop the mobile element 12 at the position indicated by the central control apparatus 50. The power may be supplied in this way to the excitation coil 42 from the driver 53 controlled by the controller 51. The excitation coil 42 may generate a magnetic field, thereby generating a propulsive force in conjunction with the magnet 41 (see FIG. 4) to drive the mobile element 12.

While FIG. 5 illustrates that the control data is superimposed on the electric current passing through the electrical supply line 43 for transmission to the mobile element 12, other ways for sending the control data may be used. It is possible, for example, to send the control data using optical communications or radio communications, such as provided on the guide rail 11. Additionally, if the distance of movement of the mobile element 12 is short, it is possible to employ a communication method where the control data from the central control apparatus 50 to the controller 51 is transmitted by means of cable secured cable bearers along the guide rail 11.

Figure 6:
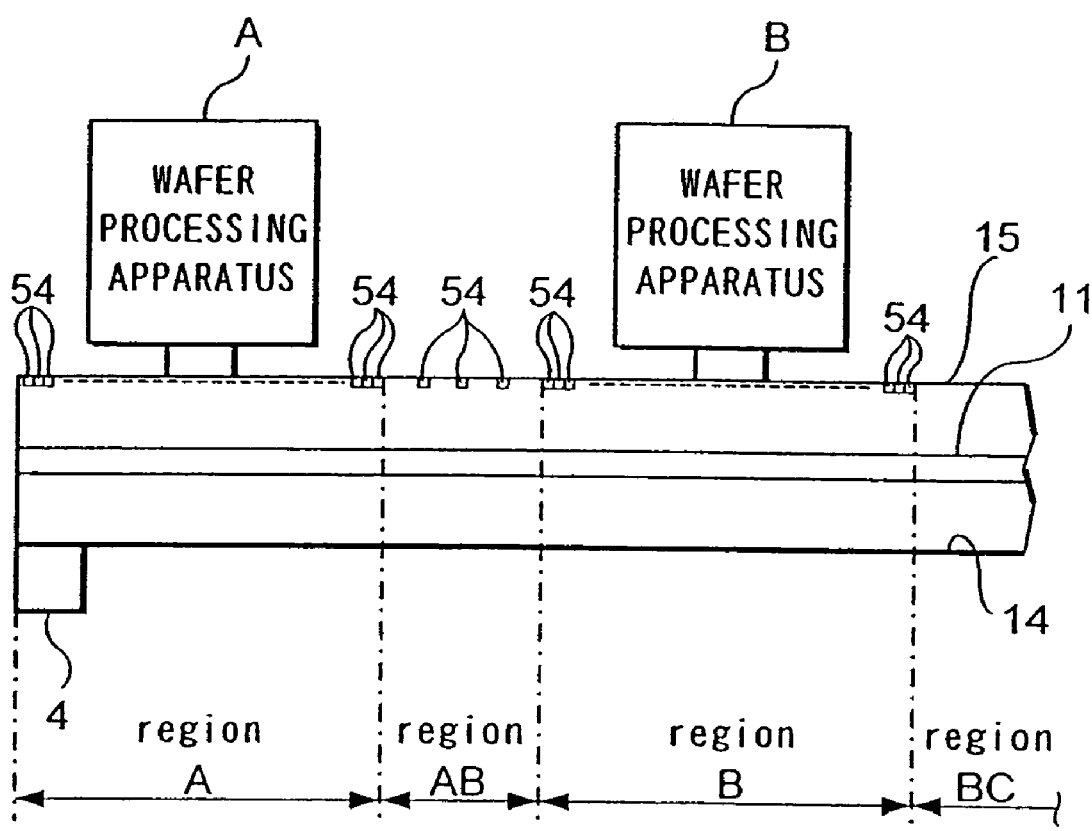
FIG. 6 is a diagram for explaining the arrangement of position sensors which may be constituents of the above-mentioned control system.

FIG. 6 is a diagram showing the arrangement of position sensors 54 for performing position detection of the mobile element 12. The position sensors 54 may be positioned at the sides of the guide rail 11 in the partition panel 15. The position sensors 54 may be spaced, e.g. every 50 µm, to accommodate precise positioning of the wafer transfer robot 13 at locations where the wafer transfer robot 13 exchanges wafers with the wafer processing apparatus (wafer exchange positions). The position sensors 54 may also accommodate positioning the wafer transfer robot 13 where exchanges of wafers with the cassettes 4 occur. The position sensors 54 may also be used to define an area, such as regions A and B in the drawing, where there is a possibility that the mobile element 12 will stop. Using the position sensors 54, it is possible to precisely detect the positions of the mobile element 12 in defined areas. Around the middle of each wafer processing apparatus (regions AB and BC in the drawing), that is, in the area of positions where there is no need for the mobile element 12 to stop, the position sensors may be arranged with a large spacing. By densely arranging the position sensors 54 in the vicinity of positions requiring a high degree of precision for position detection and arranging position sensors 54 more sparsely at other locations, it may be possible to precisely perform position control of the mobile element 12 and control costs. When making a chamber 14 having the position sensors 54, the portions in which the position sensors 54 are densely spaced (such as regions A and B) and the portions in which the position sensors 54 are sparsely spaced (such as regions AB and BC) can be made as separate units which may be combined to make a chamber 14. While the arrangement of the position sensors 54 can be as described above, the position sensors 54 may also be arranged in other arrangements, such as by being equally spaced.

Wafer Conveyance Operation by Wafer Conveyance System

A wafer conveyance operation, such as by a wafer conveyance system having the structure described above, is described. Semiconductors may be produced by performing processes, such as processed A through Z, on the wafers. Unprocessed wafers may be housed in a cassette 4. The mobile element 12 may move along the guide rail 11. The mobile element 12 may stop near the cassette 4. And after the wafer transfer robot extracts a single wafer from the cassette 4, the mobile element 12 may move to stop at a position in front of the wafer processing apparatus A (wafer exchange position). Thereafter, the wafer transfer robot 13 may set the wafer extracted from the cassette 4 on the wafer insertion portion of the wafer processing apparatus A. When the wafer is set on the wafer processing apparatus, a predetermined process may be performed on the set wafer by the wafer processing apparatus A.

The A-processed wafer which has been processed by the wafer processing apparatus A may be extracted from the wafer insertion portion of the wafer processing apparatus A by the wafer transfer robot 13. After the mobile element 12 moves to stop at a position in front of the wafer processing apparatus B (wafer exchange position), the wafer transfer robot 13 may set the A-processed wafer in the wafer insertion portion of the wafer processing apparatus B. When the wafer has been set, a predetermined process may be performed on the wafer set by the wafer processing apparatus B.

The A-processed and B-processed wafer, processed by the wafer processing apparatuses A and B, may be extracted from the wafer processing apparatus B by the wafer transfer robot 13. The mobile element 12 may move to stop at a position in front of the wafer processing apparatus C. The wafer may be conveyed through the sequence of wafer processing apparatus C, etc., through wafer processing apparatus Z, to perform predetermined processes by the wafer processing apparatus. A processed wafer which has been processed by the wafer processing apparatus Z, e.g., a wafer which has been completely processed, may be extracted from the wafer insertion portion of the wafer processing apparatus Z by the wafer transfer robot 13. The mobile element 12 may proceed to a position in front of the cassette 4 positioned at the downstream side (right side of FIG. 3) of the conveyance direction. Other conveyance directions may also be used. The wafer which has been completely processed may be housed in the cassette 4 by the wafer transfer robot 13.

The wafer transfer robot 13, which moves between wafer processing apparatuses, is capable of placing one wafer at a time in the apparatuses. After each processes has been completed, the processed wafer can immediately be set in the wafer processing apparatus to perform the next process. Therefore, the next process can be performed without having to wait for the processing of other wafers to be completed, or being stored in a stocker. The time at which the last process is completed after performing the first process on the wafer, that is, the time until completion of a single product, may be shortened. It is possible to reduce the time required until completion of a single product in comparison to existing systems when producing prototype products or a small amount of products. Additionally, it is possible to convey and processed wafers without installing stockers for housing a plurality of cassettes 4.

The system may be adapted to changed processing steps. For example, when a processing procedure is changed according to the type of product, such as by not performing process C, it is possible to adapt the system to the changed processing steps, such as by making the mobile element 12 pass over the wafer processing apparatus C without stopping. Therefore, the wafer conveyance system may be suited to use as a conveyance system in small-scale production such as in the case of prototype products or system LSI. Additionally, since the time between the completion of one process and the commencement of the next process for a single wafer may be shortened, it is possible to reduce cases in which dust adheres on the wafer or the wafer oxidizes after the cleansing process while waiting for the coating process. Therefore, yield may be increased.

When conveying wafers between a large numbers of wafer processing apparatus as described above, the conveyance distance, that is, the distance which the guide rail 11 is laid may become long. When the path of movement of the mobile element 12 is long in this way, it may be difficult to drive the mobile element 12 with a drive system using ball screws. However, by driving the mobile element 12 with a linear motor and providing a non-contact electrical supply, the mobile element 12 may be moved long distances. The mobile element 12 may therefore move between large numbers of wafer processing apparatus. Additionally, since fewer frictional parts may be used than in systems using ball screws, the creation of dust may also be reduced. Additionally, by performing feedback control using a linear motor system, it may be possible to perform high precision positioning of the mobile element 12, making it possible to exchange wafers which require a high degree of precision.

The wafer may be conveyed only inside the chamber 14 and it is possible to maintain a high degree of air purity inside chamber 14. It is not necessary to maintain the entire factory inside which the equipment is provided as a clean room. This may largely reduce the cost required to provide manufacturing equipment, and reduce the production costs of the product. Additionally, since it is no longer necessary to provide a wafer transfer apparatus for each wafer processing apparatus, the efficiency of installation space may be improved. Reducing the number of required devices and parts may further reduce the cost of providing manufacturing equipment.

Furthermore, control data may be supplied from the central control apparatus 50 to the mobile element 12 using the electrical supply line 43 for supplying power to the mobile element 12, thus simplifying the control system. Additionally, since the controller unit 20 having the controller 51 may be attached to the mobile element 12, the control of the fine movement such as positioning of the mobile element may be performed on the mobile element 12, thus simplifying the control system. Additionally, the controller unit 20 may be attached in either of the movable directions of the mobile element 12, so that there is no need to increase the area of the chamber 14, i.e. the clean room in the cross direction (up-down direction in FIG. 3), and the cost due to providing manufacturing equipment can be controlled.

Modification

Figure 7:
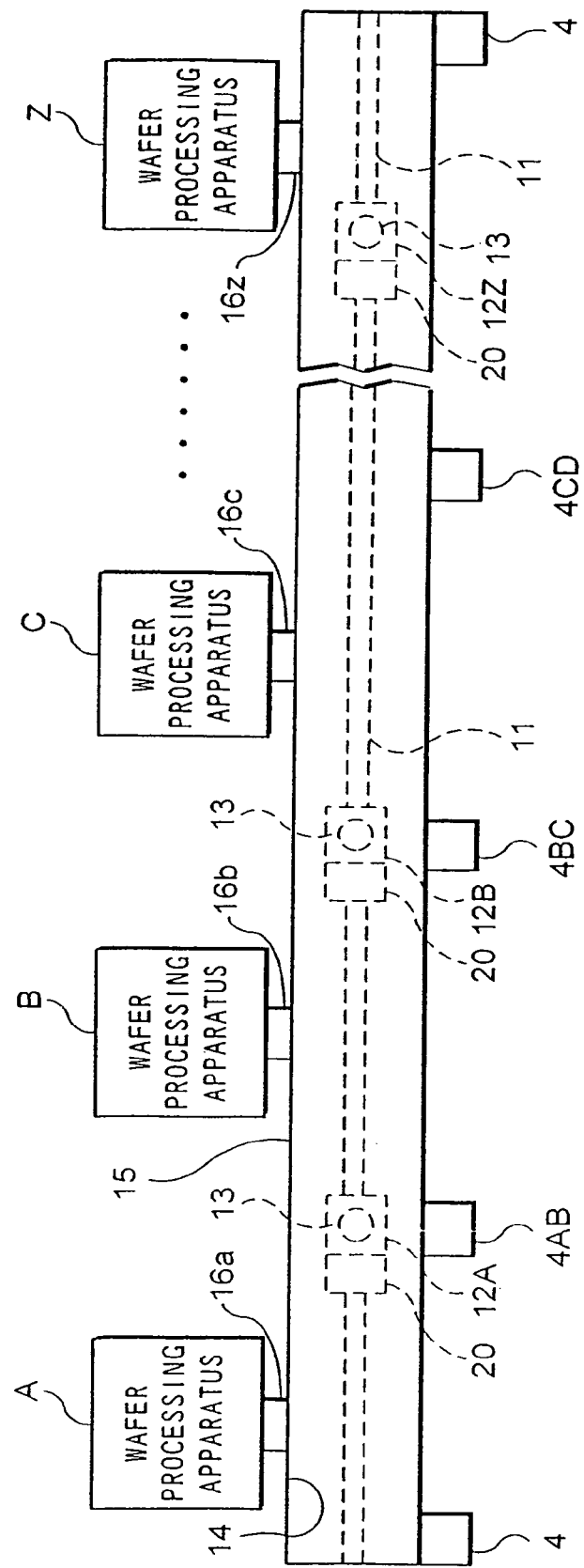
FIG. 7 is a schematic plan view showing semiconductor production equipment provided with another example of the wafer conveyance system.

FIG. 7 is a schematic plan view showing semiconductor production equipment provided with another example of the wafer conveyance system. In the above-described system, only one mobile element 12 is shown provided on the guide rail 11, but it is possible to position a plurality of mobile elements 12 on the guide rail 11. It is possible to have a mobile element 12A, a mobile element 12B, etc., through mobile element 12Z corresponding to the wafer processing apparatus A, wafer processing apparatus B, etc., through wafer processing apparatus Z. The wafer transfer robot 13 may be provided on the mobile element 12A that extracts a wafer from the cassette 4. The wafer transfer robot 13 may set the wafer in the wafer processing apparatus A, and then extract the A-processed wafer from the wafer processing apparatus A. The wafer transfer robot 13 may house the wafer in the cassette 4AB. Thereafter, the wafer transfer robot 13 mounted on the mobile element 12B may extract the A-processed wafer from the cassette 4AB and set it on the wafer processing apparatus B. Then the wafer transfer robot 13 may extract the B-processed wafer from the wafer processing apparatus B and house it in the cassette 4BC. In such as way, the wafer transfer robot 13 mounted on each mobile element 12A, 12B, etc. may exchange wafers between a corresponding wafer processing apparatus and cassette. In such as way, after a wafer is extracted from the cassette 4 which houses unprocessed wafers and the processing at the wafer processing apparatus A is completed, it is possible to extract the next wafer from the cassette 4 and set it in the wafer processing apparatus A to perform wafer processing continuously, making it possible to process a large number of wafers in a short time. Wafer transfer robots 13 mounted on adjacent mobile elements 12 can exchange wafers through cassettes in this way, and the mobile element 12 which has received a wafer can move to the wafer exchange position of the wafer processing apparatus for performing the next process, to set the wafer in this wafer processing apparatus.

Additionally, even when a plurality of mobile elements 12 are arranged as described above, the controller 51 mounted on each mobile element 12 may control the positioning of each. It is not necessary to provide a control apparatus or the like outside of each mobile element, thus preventing the control system from becoming too complex.

Instead of providing a mobile element 12 for each wafer processing apparatus, it is possible to provide a single mobile element 12 corresponding to a plurality of wafer processing apparatuses. Additionally, it is possible to provide a plurality of mobile elements 12 on the guide rail 11 and have the central control apparatus 50 set the range which the mobile element 12 moves in accordance with the types of products to be manufactured. In the case where one of the mobile elements 12 has failed, it is possible to have other mobile elements 12 cover the range of movement of the failed mobile element 12. When the range of movement of the mobile element 12 is made arbitrary, collisions between the mobile elements can be prevented by the controller 51 mounted on each mobile element 12 detecting from the position data of the position sensors 54 position data of the mobile elements moving thereof.

Additionally, in the above-described modification, the exchange of wafers may be performed by providing cassettes between the wafer processing apparatus and having the wafer transfer robots 13 mounted on the mobile elements 12 exchange wafers through the cassettes. In addition, wafers may be exchanged directly between wafer transfer robots 13 mounted on adjacent mobile elements 12, and or to exchange wafers through simple wafer transfer stands instead of the cassettes.

Figure 8:
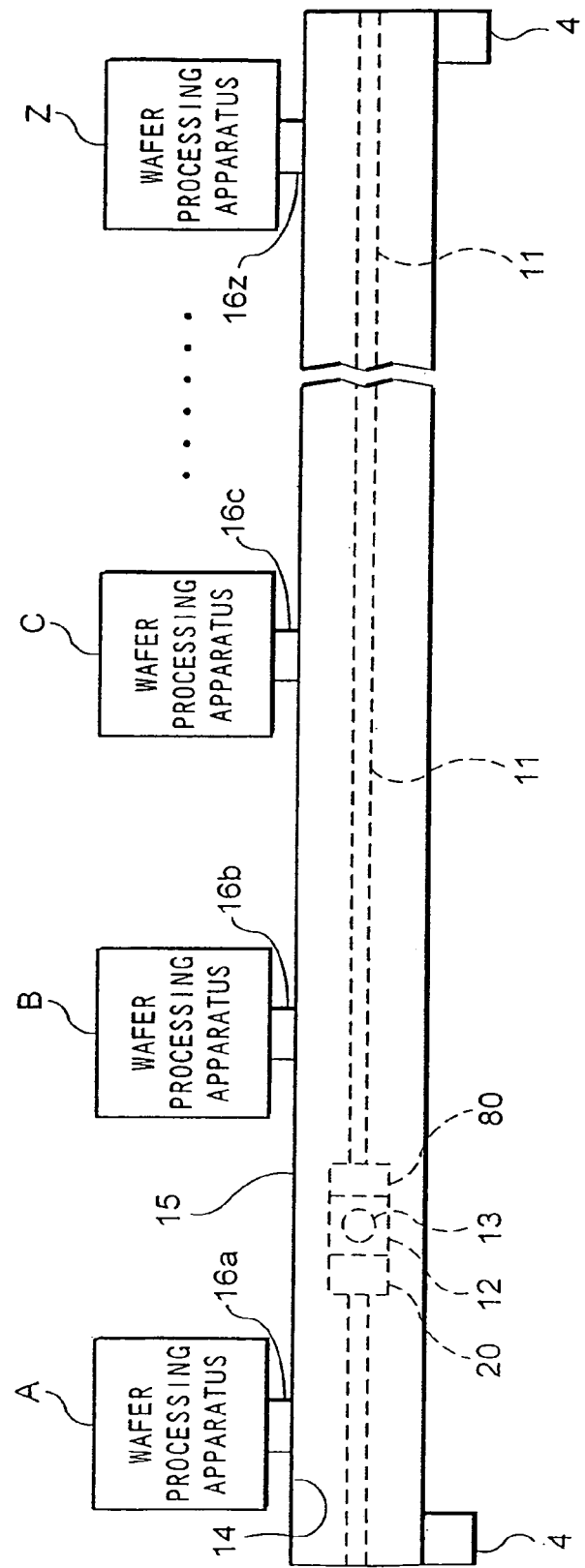
FIG. 8 is a schematic plan view showing semiconductor production equipment provided with another modification example of the wafer conveyance system.

FIG. 8 is a schematic plan view showing semiconductor production equipment provided with another modification example of the wafer conveyance system. It is possible to provide a notch aligner (position-holding adjustment unit) 80 on the side of the mobile element 12 in the direction of movement. The notch aligner 80 may adjust the orientation and position of the wafer. While wafers are formed in the shape of disks, there are cases in which a notch is formed in one portion thereof to determine the orientation when setting them in wafer processing apparatus. If the wafer processing apparatus do not include notch aligners, then the orientation and position of setting the wafer in the wafer processing apparatus may be adjusted by the notch aligner 80. Additionally, if the notch aligner 80 is provided on the side of the direction of movement of the mobile element 12, there may be no need to increase the area of the clean room.

Other Semiconductor Production Equipment

Figure 9:
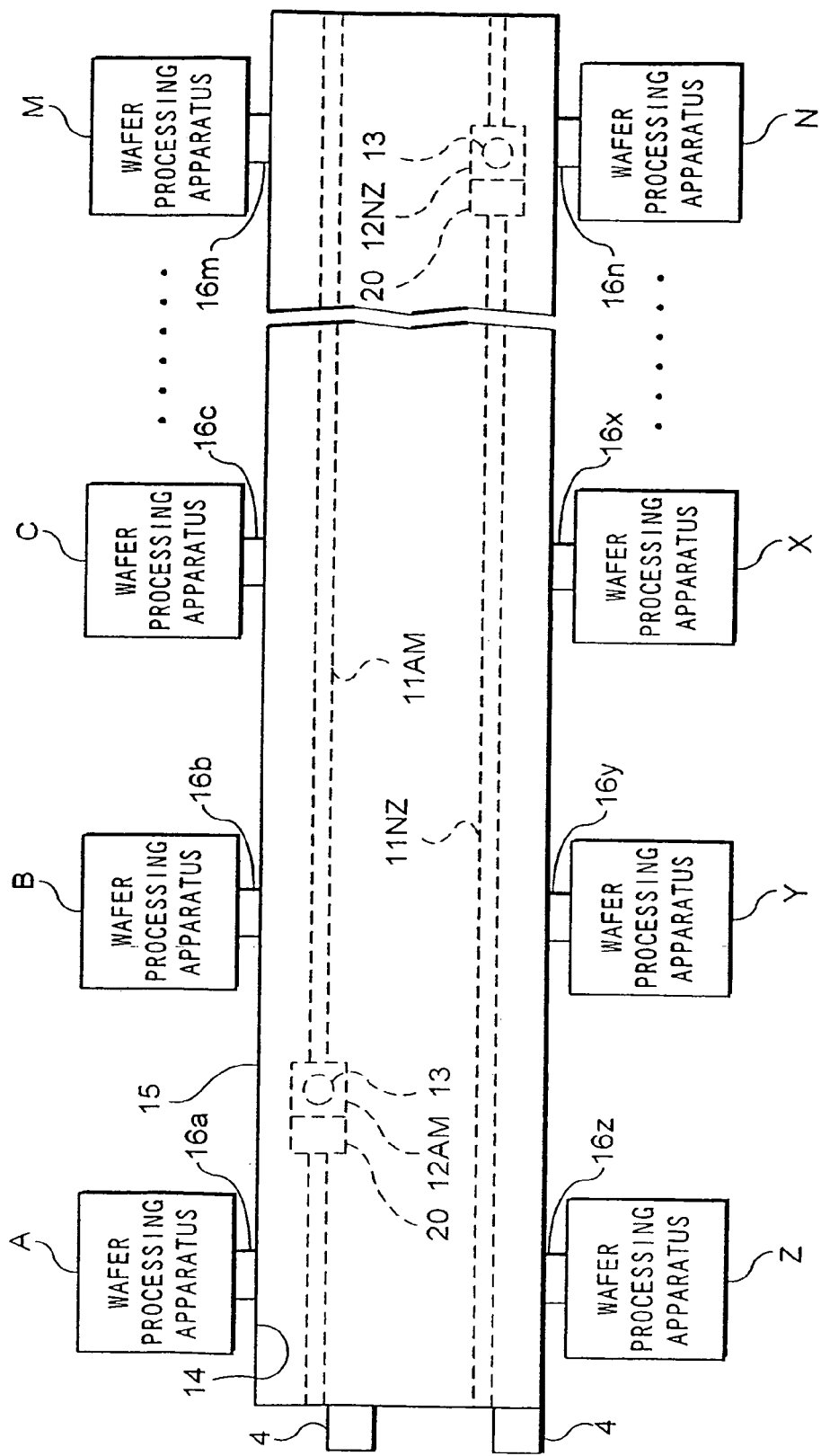
FIG. 9 is a schematic plan view showing other semiconductor production equipment provided with a wafer conveyance system.

FIG. 9 is a schematic plan view showing other semiconductor production equipment provided with a wafer conveyance system. The elements which are common to those described are indicated by the same reference numbers and their explanation is omitted. There may be two rows of wafer processing apparatus. In a top row in the drawing, wafer processing apparatus A, wafer processing apparatus B, etc., through wafer processing apparatus M may be arranged. In the bottom row, wafer processing apparatus N, wafer processing apparatus X, wafer processing apparatus Y and wafer processing apparatus Z may be arranged.

Two rows of guide rails 11AM, 11NZ may be provided to correspond with the wafer processing apparatus arranged in two rows. A mobile element 12AM and a mobile element 12NZ may be positioned movably on the respective guide rails 11AM and 11NZ. The mobile elements 12AM and 12NZ may include the same structure as the mobile element 12 described above, and may be driven over the guide rail 11AM and guide rail 11NZ by way of a linear motor. Additionally, the mobile element 12AM and mobile element 12NZ may both include a wafer transfer robot 13 and a controller unit 20 as described above.

Since the guide rail 11AM and guide rail 11NZ may be provided inside the chamber 14, the chamber 14 may be shaped to be larger in the cross direction (up-down direction in the drawing) than the chamber 14 described above. Otherwise the structure may be the same as the structure described above. The inside of the chamber 14 may be a clean room having higher air purity than the outside of the chamber 14. Additionally, two cassettes 4 may be provided on the left edge of the drawing outside the chamber 14. The cassette 4 positioned on the guide rail 11AM side may house unprocessed wafers, and the cassette 4 on the guide rail 11NZ side may house processed wafers.

The mobile element 12AM may move near the cassette 4 housing unprocessed wafers, such as along the left edge of the drawing. After the wafer transfer robot 13 mounted on the mobile element 12AM extracts an unprocessed wafer from the cassette 4, the mobile element 12AM may move to a position in front of the wafer processing apparatus A. Then the wafer transfer robot 13 may set the wafer extracted from the cassette 4 on the wafer insertion portion of the wafer processing apparatus A. The A-processed wafer may be extracted from the wafer processing apparatus A by the wafer transfer robot 13. The mobile element 12AM may move to be positioned in front of the wafer processing apparatus B.

Thereafter, the A-processed wafer may be set inside the wafer insertion portion of the wafer processing apparatus B by means of the wafer transfer robot 13, and a predetermined process may be performed by means of the wafer processing apparatus B. After the B-processed wafer has been extracted from the wafer processing apparatus B by the wafer transfer robot 13, the mobile element 12AM may move to a position in front of the wafer processing apparatus C, and exchange wafers with the wafer processing apparatus C as with the wafer processing apparatus A and B. The same operation may be performed through the wafer processing apparatus C-M.

When a determined process has been performed on the wafer by the wafer processing apparatus M, an M-processed wafer may be extracted from the wafer processing apparatus M by the wafer transfer robot 13. At this time, the mobile element 12NA positioned on the guide rail 11NZ has moved in front of the wafer processing apparatus N, and an M-processed wafer may be transferred directly or through a temporary placement stand from the wafer transfer robot 13 of the mobile element 12AM to the wafer transfer robot 13 of the mobile element 12NZ. When the wafer transfer robot 13 of the mobile element 12NZ receives the M-processed wafers from the wafer transfer robot 13 of the mobile element 12AM, it sets the received wafer in the wafer insertion portion of the wafer processing apparatus N. Then, after a predetermined process has been performed by means of the wafer processing apparatus N, an N-processed wafer may be extracted from the wafer processing apparatus N by means of the wafer transfer robot 13 of the mobile element 12NZ.

The mobile element 12NZ and wafer transfer robot 13 may sequentially convey the wafer from a wafer processing apparatus O (not shown) to the wafer processing apparatus Z as the case with the above-mentioned mobile element 12AM. After the Z-processed wafer has been extracted from the wafer processing apparatus Z, the mobile element 12NZ may move to house in the cassette 4 the wafer on which processes A-Z has been performed.

Mobile elements 12AM and 12NZ may be provided for the respective guide rails 11AM and 11NZ. Therefore, the mobile element 12AM need only move between the wafer processing apparatus A and the wafer processing apparatus M. The mobile element 12NZ need only move between the wafer processing apparatus N and the wafer processing apparatus Z, thus making it possible to begin process A with respect to the next wafer upon completion of process M, which may reduce the wafer processing time. The processing time may be further reduced by positioning a plurality of mobile elements on each of the guide rails 11AM and 11NZ.

When it is not necessary to perform processing with the wafer processing apparatus M due to the type of product, the wafer transfer robot 13 of the mobile element 12AM may extract a processed wafer from a wafer processing apparatus (not shown) positioned on the upstream side of the wafer processing apparatus M. the wafer transfer robot 13 may transfer the processed wafer to the wafer transfer robot 13 of the mobile element 12NZ. Processing steps corresponding to various products may be efficiently performed without any dependence on the sequence of the wafer processing apparatus.

Another Wafer Conveyance System

Figure 10:
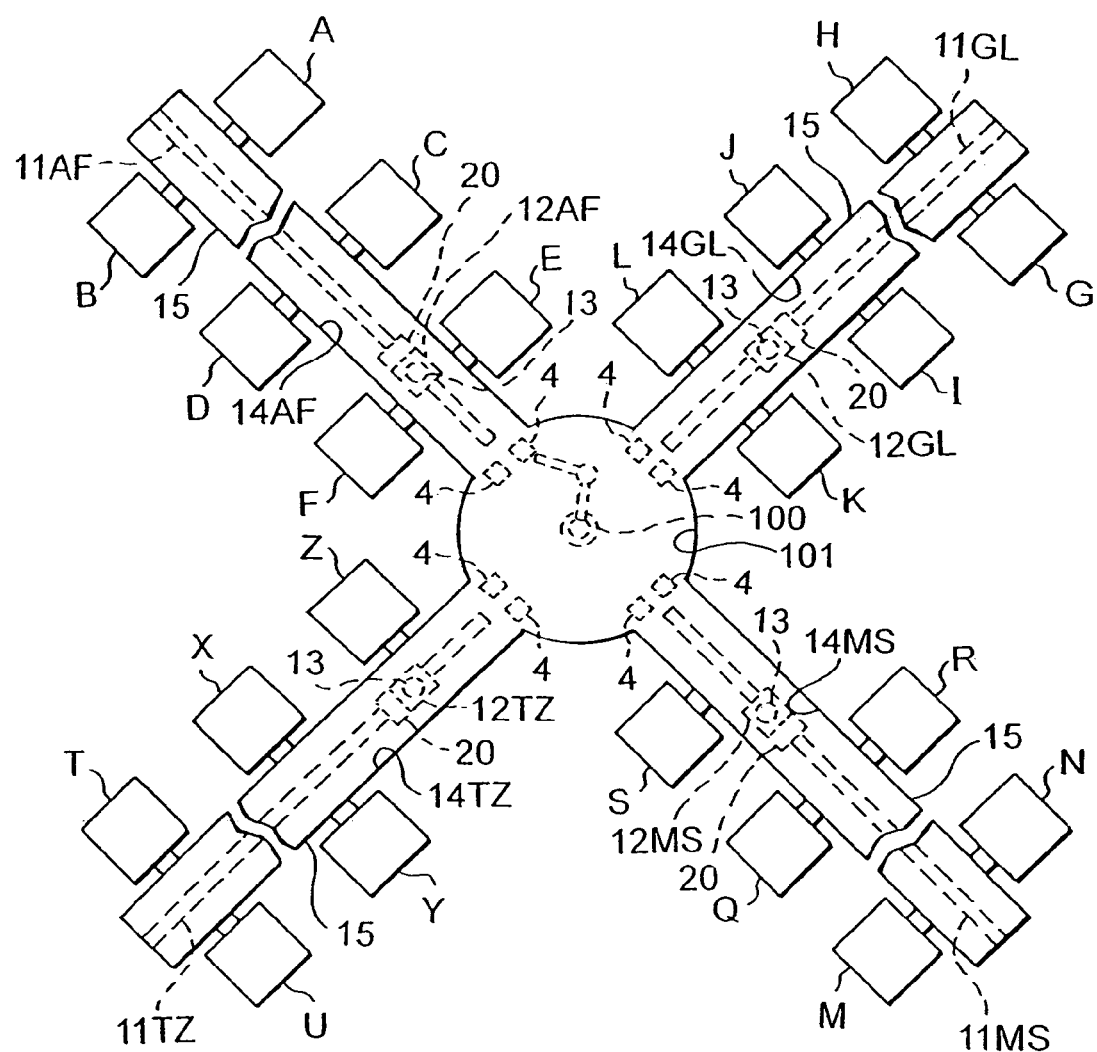
FIG. 10 is a schematic plan view showing other semiconductor production equipment provided with a wafer conveyance system.

FIG. 10 is a schematic plan view showing other semiconductor production equipment provided with a wafer conveyance system. Elements which are common to those described above shall be given the same reference numerals, and their explanation shall be omitted. A wafer transfer robot 100 may be fixed to a central portion. Chamber 101 may be formed to surround the wafer transfer robot 100. Chamber 14AF, chamber 14GL, chamber 14MS and chamber 14TZ may radially extend from the chamber 101. As in the first embodiment, FFU may be provided at the tops of the chamber 101 and chambers 14AF 14GL, 14MS and 14TZ, so that the insides of these chambers can be used as clean rooms having a higher degree of purity than the outside air.

The wafer processing apparatus A-F may be provided along the chamber 14AF. The wafer processing apparatus G-L may be provided along the chamber 14GL. The wafer processing apparatus M-S may be provided along the chamber 14MS. The wafer processing apparatus T-Z may be provided along the chamber 14TZ.

A guide rail 11AF may be laid inside the chamber 14AF, and a mobile element 12AF may be movably provided on the guide rail 11AF. As described above, the mobile element 12AF may be driven by a linear motor. A wafer transfer robot 13 and controller unit 20 may be mounted on the mobile element 12AF, to exchange wafers between the wafer processing apparatus A-F. Since the chamber 14GL, chamber 14MS and chamber 14TZ may include structures like that of chamber 14AF, their descriptions shall be omitted.

Two cassettes 4 may be positioned on the wafer transfer robot side, that is, the central side of each chamber. One of the cassettes 4 may house unprocessed wafers, while the other cassette 4 may house processed wafers. The wafer transfer robot 100 may be capable of exchanging wafers between these cassettes 4.

With this structure, when processing the wafers in the order of A-Z, the wafer transfer robot 13 of the mobile element 12AF may extract a wafer from the cassette 4 housing unprocessed wafers positioned to the central side of the chamber 14AF. After the mobile element 12AF has moved in front of the wafer processing apparatus A, the wafer transfer robot 13 may set a wafer inside the wafer insertion portion of the wafer processing apparatus A. When the wafer is set, the predetermined process may be performed on the wafer by the wafer processing apparatus A, after which the A-processed wafer is extracted by the wafer transfer robot. Thereafter, the mobile element 12AF may move in front of the wafer processing apparatus B. The wafer transfer robot 13 may set the wafer in the wafer insertion portion of the wafer processing apparatus B to perform the process B on the wafer. The B-processed wafer may be extracted by the wafer transfer robot 13. Subsequently, the same operation may be performed through the wafer processing apparatus C through F, and after being F-processed by the wafer processing apparatus F, the processed wafer may be extracted from the wafer processing apparatus F by the wafer transfer robot 13. The mobile element 12AF may move to the central side of the chamber 14AF, and house the wafer which has undergone processes A through F in the cassette 4.

A wafer which has undergone processes A through F housed in the cassette 4 may be extracted from the cassette 4 by the wafer transfer robot 100, and housed in the cassette 4 for unprocessed wafers on the central side of the chamber 14GL. The wafer may be extracted from the cassette 4 by a wafer transfer robot 13 mounted on a mobile element 12GL provided inside the chamber 14GL. Thereafter, the extracted wafer may be conveyed to the wafer processing apparatuses G through L in the same manner as for the operations for the wafer processing apparatus A through F. The wafer which has undergone the processes of each wafer processing apparatus may be housed in the processed cassette 4. Subsequently, the wafer may be sequentially conveyed to the chamber 14MS and chamber 14TZ to complete the processes A through Z.

In such a wafer conveyance system, it is possible to reduce the cost of manufacturing equipment and shorten production time. Additionally, when producing a plurality of types of products, if a certain product does not require processes M through S, then the wafer transfer robot 100 can be made to convey the wafers which have undergone processes A through L from chamber 14GL to the chamber 14TZ. By skipping processing steps which are not required depending on the product, the production time of the products may be further reduced.

While the chambers were arranged to radiate in four directions, it is possible to have other arrangements, such as by providing six or eight radial chambers. The number and arrangement of radially provided chambers is implementation dependent. Additionally, it is possible to provide a plurality of mobile elements inside each radially arranged chamber.

Other Semiconductor Production Equipment

Figure 11:
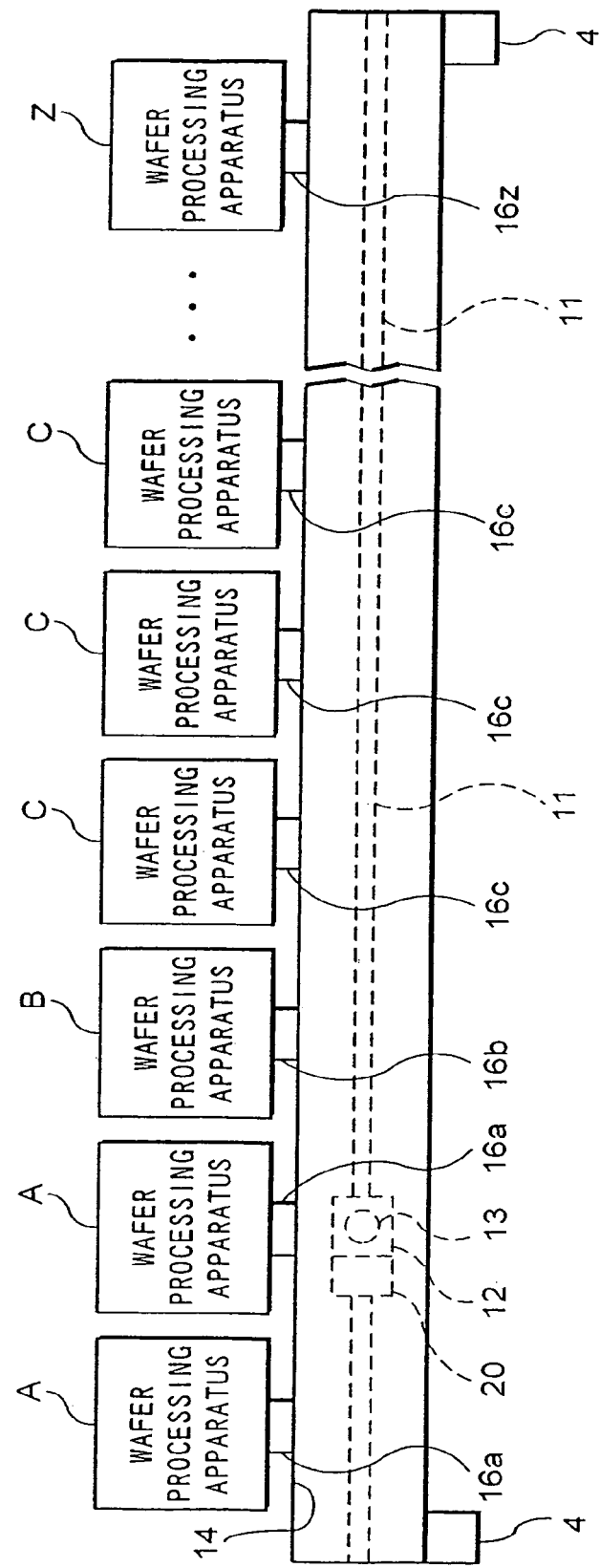
FIG. 11 is a schematic plan view showing other semiconductor production equipment provided with a wafer conveyance system.

FIG. 11 is a schematic plan view showing other semiconductor production equipment provided with a wafer conveyance system. Elements common to the elements described above are given the same reference numerals and their explanation omitted. A plurality of wafer processing apparatuses for performing processes on the wafers may be provided. Two wafer processing apparatuses A may be positioned adjacent to each other, and three wafer processing apparatuses C may be positioned adjacent to each other. Process A can be performed simultaneously with respect to two wafers, and process C can be performed simultaneously with respect to three wafers, thereby shortening the production time.

Such an arrangement of wafer processing apparatuses may be beneficial, for example, if the time required for process A in the wafer processing apparatus A is two minutes, the time required for process B in the wafer processing apparatus B is one minute and the time required for process C in the wafer processing apparatus C is three minutes. Such an arrangement may be referred to as a tact system, that is, a system in which the wafer processing apparatus are provided such that the time required for each processing step from A-Z is the same.

A plurality of the wafer processing apparatus for performing the same process may be arranged in a single row, but it is possible to arrange the wafer processing apparatus for performing the same process in other forms. The wafer transfer robot 13 may be made to directly set the wafers in the wafer processing apparatus A. It is also possible to provide a fixed wafer transfer robot 120. It is possible to transfer wafers from the wafer transfer robot 13 to the wafer transfer robot 120, and set the wafers from the wafer transfer robot 120 in the wafer processing apparatus A. It is possible to have the mobile element 12 stop at the wafer exchange position of the wafer processing apparatus A, so that the wafer transfer robot 13 will exchange wafers to the wafer processing apparatus A indirectly through the wafer transfer robot 120. It is also possible not to have a tact system as described above, but instead to provide the same number, e.g. three, of each type of wafer processing apparatus.

Buffer Cassettes

Figure 12:
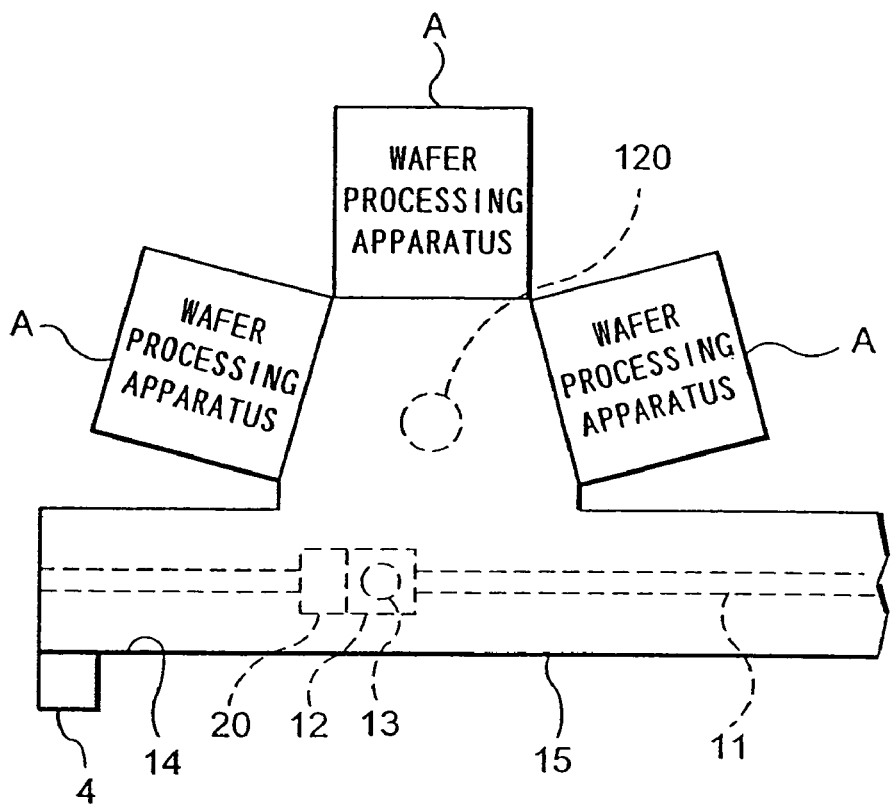
FIG. 12 is a schematic plan view showing another example of the wafer conveyance system.
Figure 13:
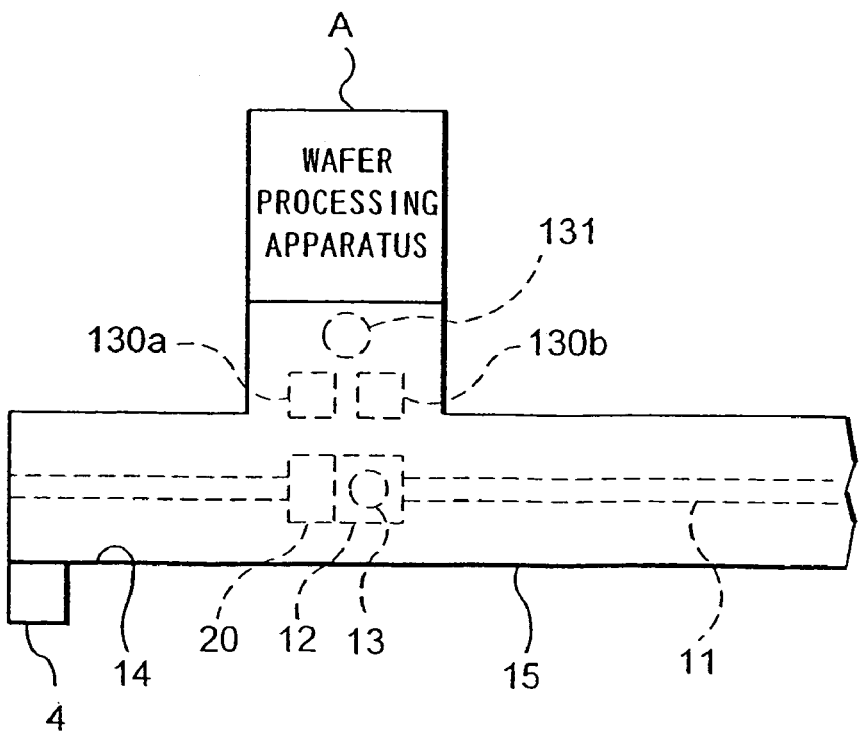
FIG. 13 is a schematic plan view showing another example of the wafer conveyance systems.

FIGS. 12 and 13 are a schematic plan view including other examples of the wafer conveyance system. It is possible to provide, for each wafer processing apparatus, a buffer cassette 130a for temporarily storing unprocessed wafers and a buffer cassette 130b for temporarily storing processed wafers. A wafer transfer robot 131 may be fixed between the buffer cassettes 130a, 130b and the wafer processing apparatus. The wafers may be exchanged between the buffer cassettes 130a, 130b and the wafer processing apparatus. The wafer transfer robot 13 may be made to exchange wafers indirectly through the buffer cassettes and the wafer transfer robot 131.

The wafer transfer robot 13 may extract, such as sequentially extract, unprocessed wafers and accumulate them in the buffer cassette 130a. If the wafer transfer robot 13 is made to be able to simultaneously hold a plurality of wafers, a large number of wafers can be conveyed more quickly. While the wafers may be sequentially collected in the buffer cassette 130a, the wafer transfer robot 131 may extract a single wafer from the buffer cassette 130a and set it in the wafer processing apparatus A to perform the process A. When the process A has been completed, the processed wafer may be extracted from the wafer processing apparatus A by the wafer transfer robot 131, and collected in the buffer cassette 130b. After the A-processed wafers are collected in the buffer cassette 130b, the wafer transfer robot 131 may extract a wafer accumulated in the buffer cassette 130a and set the wafer in the wafer processing apparatus A. At this time, an A-processed wafer may be extracted from the buffer cassette 130b by the wafer transfer robot 13, and may be collected in a buffer cassette for housing unprocessed wafers provided for wafer processing apparatus B (not shown). By repeating this operation, the wafers may be conveyed to the wafer processing apparatus to undergo each of the processes. As a result, it is possible to reduce the production time.

Figure 14:
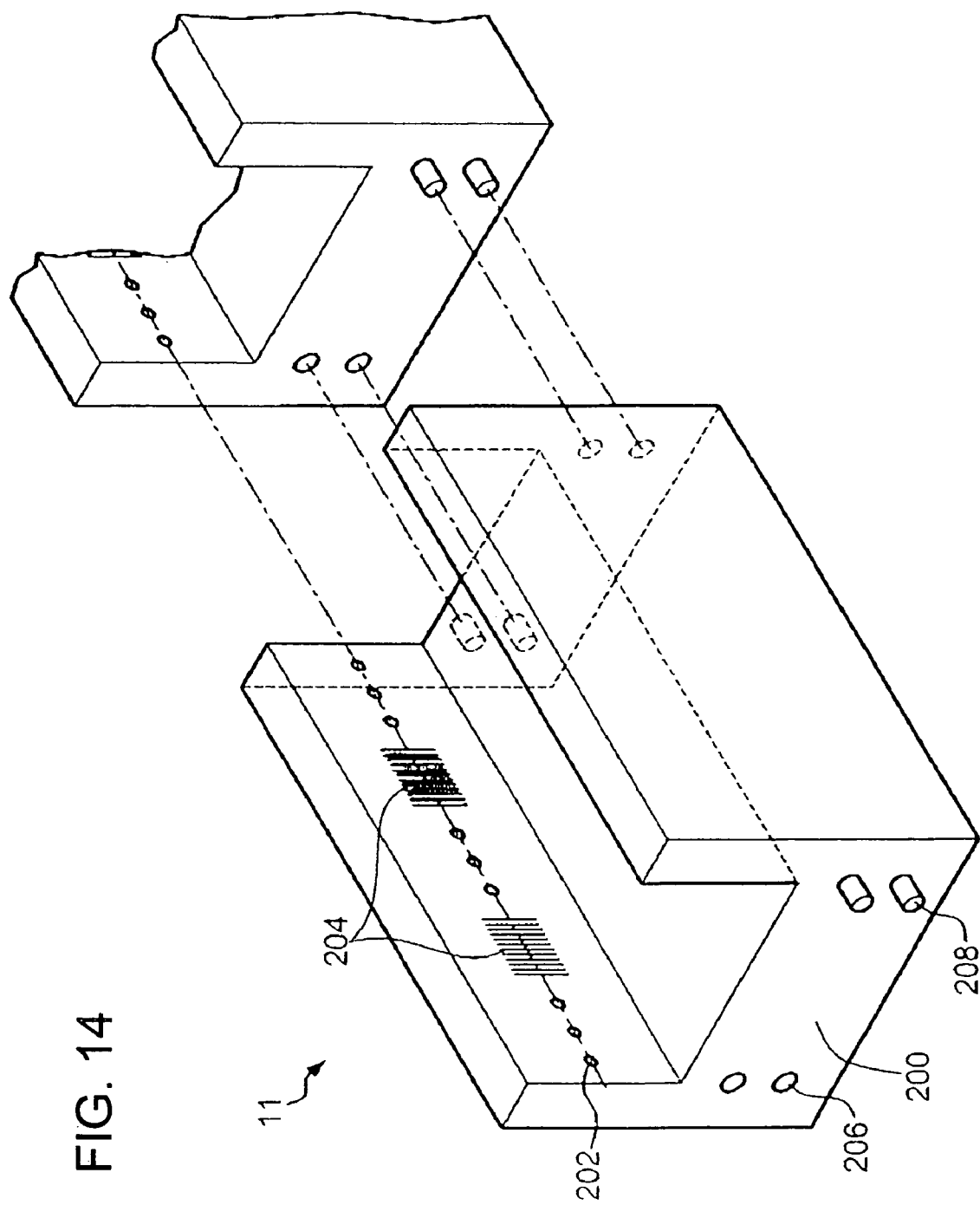
FIG. 14 is a schematic perspective view of a guide rail for semiconductor production equipment.

FIG. 14 is a schematic perspective view of a guide rail, such as guide rail 11, for semiconductor production equipment. The guide rail 11 may be constructed of a plurality of rail units. The rail units may be removably assembled together at an end 200 of the first rail unit to an end of the second rail unit to form at least a portion of the guide rail 11. Different sized rail unit may be interchangeably assembled. Each rail unit is approximately 1 meter to 5 meters in length. Other sized units may be used. Units of more than about 10 meters in length may be used to construct long runs of the guide rails 11. The guide rails 11 may be used to connect groups of wafer processing stations that are located apart from each other.

Sensors may be provided along the rail units of the guide rail 11. A first type of sensor may include a robot detecting sensor 202. The robot detecting sensors 202 may be made of light emitting diodes (LEDs) or magnets. The detecting sensors 202 may be used to detect robots that pass by the sensor 202. The detecting sensors 202 may be located near both ends 200 of the rail units. A second type of sensor 204 may be used to detect a position of the robot. The robot positioning sensors 204 may be made of optical and/or magnetic sensors. The positioning sensors 204 may be located near the wafer processing stations, where a more precise determination of the position of the robot may be required. The positioning sensors 204 may be densely grouped, each group capable of being located near a wafer processing station. In a group, the sensors may be arranged at very narrow intervals, such as 5 µm or narrower intervals. Sensors 202 and/or 204 may be located farther apart from each other along the guide rail when not located near a wafer processing station. The robot detecting sensors 202 may be located at larger intervals from each other than the positioning sensors 204. Precise locating of the robot may not be necessary when not near the wafer processing station.

The rail unit may have the variable number of groups of sensors 202 and/or 204. For instance, there may be the unit of 1 meter length may have only one group of sensors 202 and/or 204. There may the unit of 1 meter length which has more than one group of sensors 202 and/or 204. Depending on the sizes of processing stations and the layout of locations of these processing stations, the units of different lengths with the different numbers of groups of positioning sensors 204 may be used. Typically, the unit of 1 meter length has only one group of the positioning sensors 204 located in the middle, and the unit of 2 meters length has six groups of the positioning sensors 204 spaced, for example, at regular intervals apart from each other. Also, in one unit, not all of the groups of sensors 202 and/or 204 need to be used. There may be a unit in which three groups of sensors 202 and/or 204 are used although the unit that has six groups of sensors.

As described above, the rail units may include groups of detecting sensors 202 at both ends 200 of the rail unit. No matter which end 200 of the rail unit another rail unit is attached, two groups of detecting sensors 202 of both rail units may be located at some intervals, while positioning sensors 204 may located near the wafer processing station. Therefore, positioning or repositioning of the sensors 202 and/or 204 is not necessary after the rail units are connected to form the guide rail 11 and/or connected to wafer processing apparatuses. Because the guide rails 11 can be disconnected and/or connected at the ends 200 between the rail units including the sensors 202 and/or 204, rearrangement and/or reattachment of sensors is no longer necessary when changing a configuration and/or extending the layout of the guide rail 11. Therefore, it may be easier to establish varying configurations of the guide rails 11.

The rail units may also include other features such as power supply element provided along the rail unit. An electric power may be supplied to a mobile element, such as a robot, by the power supply element. The power supply element may include a laid electric cable or electric coil provided along the rail unit on an exterior or interior surface of the rail unit. The power supply element of a first rail unit may be connectable to a power supply element of a second rail unit. The rail units may also include communication elements such as an optical communication element, a radio communication element or a cable communication element laid or incorporated along an exterior or interior of the rail unit.

The rail units may also include aligning elements such as positioning holes 206 and positioning pins 208, such as at the end 200 of the units, to align the units to form the guide rail 11. The pins 208 and holes 206 may be of varying shapes and sizes, such as cylindrical, square or of a non-defined shape. Other aligning elements may also be used such as a tongue and groove. When the units are aligned together, a robot may travel along the guide rail 11.

A plurality of wafer processing stations may be arranged at different positions along the guide rail 11. The robot may transport wafers along the guide rail 11 and stop at the wafer processing stations where the robot may transfer a wafer into a wafer processing station. The robot may also receive a processed wafer from the station. Because the robot may be precisely located along the guide rail 11, including inside the wafer processing stations, only one robot is necessary. A separate transporting robot located inside the wafer processing station is not needed.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

The invention claimed is:

1. A wafer conveyance system for transporting one or more wafers that undergo, while being transported, different processes at a plurality of wafer processing apparatuses inside which one or more wafers are processed, the wafer conveyance system comprising:

(a) a hermetically closed chamber that defines an isolated environment inside which a controlled atmosphere is provided;

(b) at least one guide path provided inside the hermetically closed chamber;

(c) a plurality of ducts that each communicate the isolated environment of the hermetically closed chamber with the inside of one wafer processing apparatus such that the hermetically closed chamber is in communication with one or more wafer processing apparatuses;

(d) at least one mobile element being movable inside the hermetically closed chamber along the at least one guide path to transport one or more wafers from one wafer processing apparatus to another;

(e) at least one arm provided on each mobile element, each arm being accessible to the inside of each wafer processing apparatus through a corresponding duct to load one or more wafers into a wafer processing apparatus and unload the same therefrom; and (f) a plurality of position sensors that detect positions of the at least one mobile element, the position sensors being deployed along each of the at least one guide path in such a manner that they are deployed at intervals close together when near the wafer processing apparatuses and deployed at wider intervals elsewhere.

2. The conveyance system in accordance with claim 1, wherein the at least one guide path includes a first end and a second end spaced apart from the first end.

3. The conveyance system in accordance with claim 2, wherein the position sensors are located at both the first end and the second end of the guide path.

4. The conveyance system in accordance with claim 1, wherein at least one guide path comprises a first magnetic field generating element for generating a magnetic field; and the at least one mobile element comprises a second magnetic field generating clement for generating a magnetic field, forming a linear motor in conjunction with the first magnetic field generating element, and conferring a propulsive force to the at least one mobile element.

5. The conveyance system in accordance with claim 1, wherein the at least one mobile element is driven by a linear motor.

6. The conveyance system in accordance with claim 5, further comprising a power supply element provided along the at least one guide path; wherein an electric power is supplied to the at least one mobile element by means of the power supply element.

7. The conveyance system in accordance with claim 6, wherein the power supply element comprises an electric cable provided along the at least one guide path, and an electricity receiving element provided on the at least one mobile element for receiving the electric power supplied to the electric cable without contact, whereby electric power is supplied to the at least one mobile element without contact.

8. The conveyance system in accordance with claim 7, further comprising:
- a control element for control data for operating the at least one mobile element;
- a communication element provided on the at least one mobile element for performing data communication between the control element and the at least one mobile element; and
- a mobile element control unit provided on the at least one mobile element for operating the at least one mobile element based on the control data supplied from the control element through the communication element.

9. The conveyance system in accordance with claim 8, wherein the control element supplies electrical signals containing the control data through the electric cable provided along the at least one guide path; and the communication element receives the electrical signals containing the control data supplied through the electric cable by means of the control element.

10. The conveyance system in accordance with claim 8, wherein the communication element is selected from the group consisting of an optical communication element, a radio communication element and a cable communication element provided along the at least one guide path.

11. The conveyance system in accordance with claim 8, wherein the mobile element control unit is attached to the at least one mobile element on a leading side of the at least one mobile element.

12. The conveyance system in accordance with claim 8, wherein the control element generates the control data based on detection results from the position sensors and requests from the plurality of wafer processing apparatuses.

13. The conveyance system in accordance with claim 1, wherein the degree of air purity in the chamber is higher than the degree of purity outside said chamber.

14. The conveyance system in accordance with claim 1, wherein the at least one guide path is constructed of a plurality of rail units.

15. The conveyance system in accordance with claim 14, wherein the rail units are capable of being connected to and disconnected from each other.

16. The conveyance system in accordance with claim 15, wherein a plurality of configurations of the at least one guide path are established without configuring positions of the plurality of position sensors.

* * * * *

UNITED STATES PATENT AND TRADEMARK OFFICE
CERTIFICATE OF CORRECTION

PATENT NO. : 7,278,812 B2 Page 1 of 1
APPLICATION NO. : 11/045787
DATED : October 9, 2007
INVENTOR(S) : Takumi Mizokawa et al.

It is certified that error appears in the above-identified patent and that said Letters Patent is hereby corrected as shown below:

On the Title Page

Column 2, line 4, under "ABSTRACT" after "one or more" delete "wares" and substitute --wafers-- in its place.

Column 2, line 6, under "ABSTRACT" after "environment inside which" insert --is--.

In the Claims

Column 16, in claim 4, line 48, after "field generating" delete "clement" and substitute --element-- in its place.

Column 18, in claim 16, line 48, after "are established without" delete "configuring" and substitute --reconfiguring-- in its place.

Signed and Sealed this

Sixth Day of May, 2008

JON W. DUDAS
*Director of the United States Patent and Trademark Office*